United States Patent [19]
Stark et al.

[11] Patent Number: 5,117,273
[45] Date of Patent: May 26, 1992

[54] CONTACT FOR INTEGRATED CIRCUITS

[75] Inventors: David M. Stark; Wayne D. Clark, both of Austin, Tex.

[73] Assignee: SGS-Thomson Microelectronics, Inc., Carrolton, Tex.

[21] Appl. No.: 614,296

[22] Filed: Nov. 16, 1990

[51] Int. Cl.⁵ .................. H01L 29/34; H01L 21/44
[52] U.S. Cl. .......................... 357/54; 357/55; 357/71; 357/73; 437/180; 437/235; 437/978; 437/982
[58] Field of Search ............ 357/54, 55, 71, 73; 437/180, 235, 978, 982

[56] References Cited

U.S. PATENT DOCUMENTS

| | | | |
|---|---|---|---|
| 4,485,393 | 11/1984 | Kumamaru et al. | 357/54 |
| 4,962,414 | 10/1990 | Liou et al. | 357/71 |
| 4,972,251 | 11/1990 | Lehrer | 357/54 |

Primary Examiner—Edward J. Wojciechowicz
Attorney, Agent, or Firm—Kenneth C. Hill; Richard K. Robinson; Richard A. Bachand

[57] ABSTRACT

A method for forming a contact in a semiconductor integrated circuit includes the formation of a conformal oxide layer over the device followed by formation of a doped glass layer. The integrated circuit is heated to cause the glass layer to reflow, improving planarity of the circuit. A second conformal oxide layer is then formed, and contact vias are cut through the three part interlevel dielectric layer. Side walls are then formed in the via by depositing a third conformal layer, and anisotropically etching such layer. This isolates the doped reflowable glass layer from the via. Metal interconnect can then be deposited and defined, forming a contact in the via.

28 Claims, 1 Drawing Sheet

CONTACT FOR INTEGRATED CIRCUITS

BACKGROUND OF THE INVENTION

1. Field of the Invention

The present invention relates generally to semiconductor integrated circuits, and more specifically to formation of a contact structure for such circuits.

2. Description of the Prior Art

In fabricating semiconductor integrated circuits, the integrity of various structures on the circuit is of great importance. Undesirable impurities in the wrong portions of a circuit can adversely affect its functioning.

One type of structure commonly found on a semiconductor integrated circuit is a contact from an upper level metal interconnect layer to a lower conductive structure through a contact via. An interlevel dielectric through which the contact via is cut often has a reflow glass layer to improve planarity of the chip's surface. This glass layer typically has impurities which can migrate into the metal interconnect in the via and adversely affect its operation. For example, it is known that mobile ion donation from glass layers in contact with metal interconnect can shift data retention voltages in memory circuits. Also, outgassing of solvents in such a glass layer can cause voiding in, or oxidation of, sputtered metal interconnect.

Since the formation of a reflowable glass layer improves the planarity of the integrated circuit, it is important to use such material in interlevel dielectric layers. It would be desirable to provide a technique which allows the planarity improvement of a reflowable glass without contamination of interconnect by the impurities used in standard glasses.

SUMMARY OF THE INVENTION

It is therefore an object of the present invention to provide a method and structure for use in semiconductor integrated circuits which prevents contamination of metal interconnects and contacts by impurities in an interlevel dielectric layer.

It is another object of the present invention to provide such a method and structure which allows use of commonly available reflowable glasses to improve planarity of the integrated circuit.

It is a further object of the present invention to provide such a method and structure which is compatible with standard process flows, and which adds minimal additional complexity to the fabrication of a typical integrated circuit.

Therefore, according to the present invention, a method for forming a contact in a semiconductor integrated circuit includes the formation of a conformal oxide layer over the device followed by formation of a doped glass layer. The integrated circuit is heated to cause the glass layer to reflow, improving planarity of the circuit. A second conformal oxide layer is then formed, and contact vias are cut through the three part interlevel dielectric layer. Side walls are then formed in the via by depositing a third conformal layer, and anisotropically etching such layer. This isolates the doped reflowable glass layer from the via. Metal interconnect can then be deposited and defined, forming a contact in the via.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
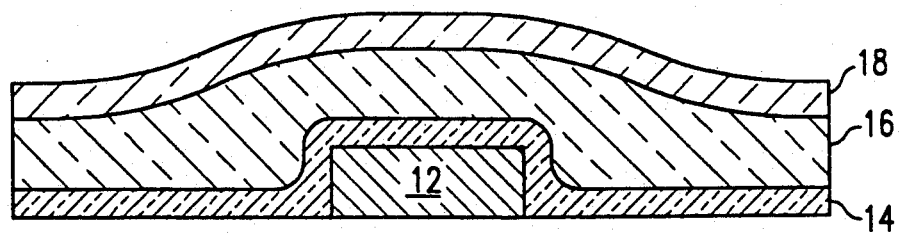
FIGS. 1-4 illustrate a preferred method for forming a contact through an interlevel dielectric layer according to the present invention.

Referring to FIG. 1, a contact is to be formed on a semiconductor substrate 10. Substrate may be simply the substrate on which an integrated circuit is formed, or it may represent multiple lower layers which have already been fabricated. The details of any such multiple lower layers are not important to the present invention.

An interconnect lead 12 is defined and patterned on the substrate 10. Interconnect 12 may be a first metal level interconnect layer, or it may be polycrystalline silicon or a silicided polycrystalline silicon layer. A conformal dielectric layer 14 is deposited over the surface of the integrated circuit, followed by a reflowable glass layer 16. Dielectric layer 14 is preferably an oxide layer, undoped or lightly doped as known in the art. Layer 14 is typically deposited using chemical vapor deposition (CVD) or low pressure chemical vapor deposition (LPCVD).

As known in the art, reflowable glass layer 16 is typically amorphous silicon dioxide doped with impurities such as boron, to form boron doped silicate glass (BSG), or boron and phosphorus to form boro-phoso-silicate glass (BPSG). Once glass layer 16 has been deposited, the integrated circuit is heated to cause the glass layer 16 to soften and partially flow into lower topographical regions on the integrated circuit. This heating is generally referred to as reflow. Heating may be performed by inserting the integrated circuit into a furnace, or through rapid thermal processing (RTP) as known in the art. Reflowing of glass layer 16 increases the planarity of its upper surface. Another conformal dielectric layer 18 is then deposited over the glass layer 16. Layer 18 is preferably a CVD or LPCVD oxide layer which is undoped or lightly doped. The three layers 14, 16, 18 together form an interlevel dielectric layer for the integrated circuit.

Figure 2:
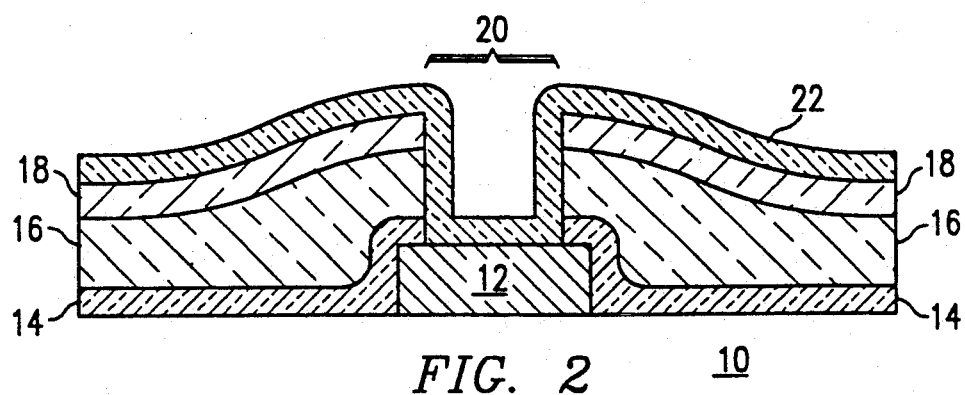

Referring to FIG. 2, a photomasking pattern (not shown) is used to define and etch contact via 20. Via 20 provides an opening through the dielectric layers 14, 16, 18 to the interconnect layer 12 beneath. A conformal dielectric layer 22 is then deposited over the integrated circuit. This layer is also preferably an undoped oxide layer deposited using CVD or LPCVD techniques.

Figure 3:
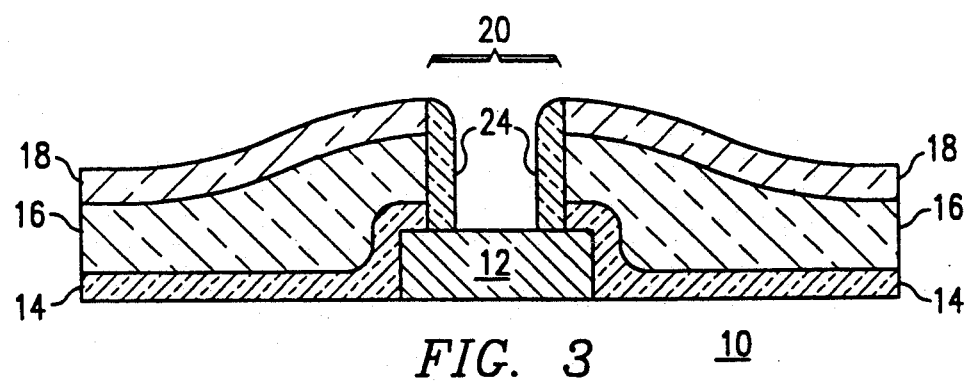

Referring to FIG. 3, the dielectric layer 22 is anisotropically etched to remove it from the horizontal surfaces of the integrated circuit. This leaves behind sidewall spacer structures 24 along the sidewalls of the contact via 20. The anisotropic etch used to form spacers 24 will also typically remove a portion of dielectric layer 18. Since over etching must be performed to ensure clearance of all oxide from the bottom of the contact via 20, layer 18 is preferably thick enough to ensure that the reflowable glass layer 16 is not exposed by such over etch.

As shown in FIG. 3, the reflowable glass 16 is completely isolated from the contact via 2o by the sidewall spacers 24. Since dielectric layer 18 was initially deposited with enough thickness to ensure that at least part of such layer remains after the anisotropic etch step, metal or other interconnect lying above the interlevel dielectric layer does not make contact with the glass layer 16.

Figure 4:
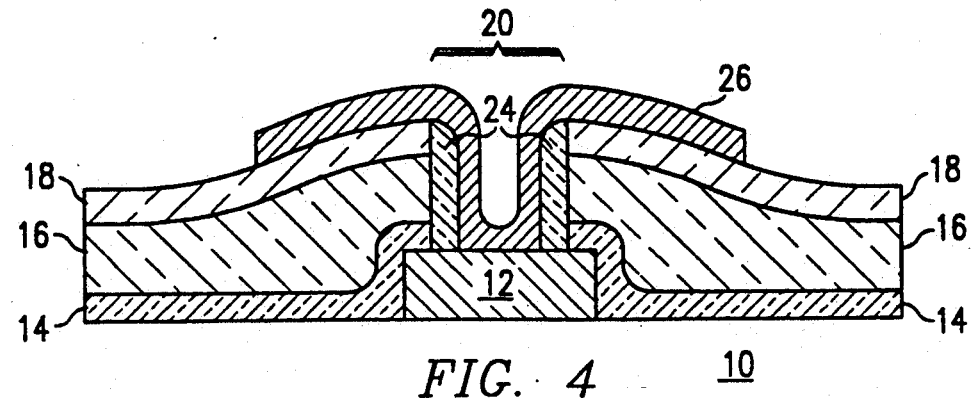

Referring to FIG. 4, interconnect layer 26 is deposited and patterned. Layer 26 can be a metal layer, such as aluminum, and can include a layer of refractory metal (not shown) beneath it as known in the art. Layer 26 could also be a polycrystalline silicon or silicided polycrystalline silicon layer as known in the art. As described above, interconnect layer 26 is separated from the reflow glass layer 16 by sidewall spacers 24 and dielectric layer 18. This protects interconnect layer 26 from impurities contained within the reflow glass layer 16.

As will be appreciated by those skilled in the art, the method described above, and the structure formed thereby, provides for isolation of an interconnect layer and contact from a reflow glass layer used for planarization of an integrated circuit. Formation of the upper layer 18 and sidewall spacers 24 adds a minimal amount of complexity to the process flow, and is compatible with standard process flows currently in use. This technique allows for improved contact formation while retaining the advantages of using a reflow glass for planarization.

While the invention has been particularly shown and described with reference to a preferred embodiment, it will be understood by those skilled in the art that various changes in form and detail may be made therein without departing from the spirit and scope of the invention.

What is claimed is:

1. A contact structure for an integrated circuit, comprising:
   a first conductor on a semiconductor substrate;
   a first dielectric layer overlying said conductor and the substrate;
   a second dielectric layer overlying said first dielectric layer;
   a third dielectric layer overlying said second dielectric layer;
   an opening through said first, second, and third dielectric layers to expose a portion of said first conductor;
   sidewall dielectric spacers along sides of said opening; and
   a second conductor overlying portions of said third dielectric layer and extending into said opening; wherein said second conductor makes electrical contact with said first conductor and is separated from said second insulating layer by said sidewall spacers and said third dielectric layer.

2. The contact structure of claim 1, wherein said second dielectric layer comprises a reflowable glass.

3. The contact structure of claim 2, wherein said second dielectric layer includes boron as a dopant.

4. The contact structure of claim 2, wherein said second dielectric layer includes phosphorous as a dopant.

5. The contact structure of claim 1 wherein said second dielectric layer comprises spin-on glass.

6. The contact structure of claim 2, wherein an upper surface of said second dielectric layer is more nearly planar than said first dielectric layer.

7. The contact structure of claim 1, wherein said first and third dielectric layers comprise substantially undoped silicon oxide.

8. The contact structure of claim 7, wherein said sidewall dielectric spacers comprise substantially undoped silicon oxide.

9. The contact structure of claim 1, wherein said first conductor comprises a conductive metal.

10. The contact structure of claim 1, wherein said first conductor comprises polycrystalline silicon.

11. The contact structure of claim 10, wherein said polycrystalline silicon is silicided with a refractory metal.

12. The contact structure of claim 1, wherein said second conductor comprises a conductive metal.

13. The contact structure of claim 1, wherein said first and third dielectric layers are conformal with their respective underlying structures.

14. An interlevel dielectric layer for an integrated circuit, comprising:
   a first layer of oxide;
   a second layer of oxide containing a doping impurity overlying said first oxide layer;
   a third layer of substantially undoped overlying said second oxide layer;
   a plurality of openings through said first, second and third oxide layers; and
   substantially undoped sidewall oxide spacers in said openings, wherein said second oxide layer is completely surrounded by said first and third oxide layer and said sidewall spacers.

15. The interlevel dielectric layer of claim 14, wherein the second oxide layer doping impurity comprises boron.

16. The interlevel dielectric layer of claim 14, wherein the second oxide layer doping impurity comprises phosphorous.

17. The interlevel dielectric layer of claim 14, wherein said second oxide layer comprises spin-on glass.

18. The interlevel dielectric layer of claim 14, wherein said first and third oxide layers, and said sidewall spacers, are substantially undoped.

19. The interlevel dielectric layer of claim 14, wherein said second oxide layer has an upper surface which is more nearly planar than said first oxide layer.

20. A method for forming an integrated circuit contact structure to a conductive region on a substrate, comprising the steps of:
   forming a first dielectric layer over the semiconductor substrate and the conductive region;
   forming a second dielectric layer over the first dielectric layer;
   heating the integrated circuit to soften the second dielectric layer, wherein the second dielectric layer partially flows into lower topographic regions of the integrated circuit, whereby an upper surface of the second dielectric layer is more nearly planar than the first dielectric layer;

forming a third substantially undoped dielectric layer over the second dielectric layer;

forming an opening through the first, second, and third dielectric layers to the conductive region on the substrate;

forming substantially undoped sidewall dielectric regions in the opening, wherein the second dielectric layer is separated from the opening thereby; and forming a conductor over portions of the third dielectric layer and extending into the opening to make contact with the conductive region.

21. The method of claim 20, wherein the second dielectric layer is formed from a glass containing boron.

22. The method of claim 20, wherein the second dielectric layer is formed from a glass containing phosphorous.

23. The method of claim 20, wherein the second dielectric layer comprises spin-on glass.

24. The method of claim 20, wherein the first and third dielectric layers are oxide layers deposited conformally with their respective underlying structures.

25. The method of claim 24, wherein the first and third dielectric layers are deposited using chemical vapor deposition.

26. The method of claim 20, wherein the conductor is formed from a conductive metal.

27. The method of claim 26, wherein the conductive region comprises a conductive metal.

28. The method of claim 26, wherein the conductive region comprises polycrystalline silicon.

* * * * *